(12) United States Patent
Jamison et al.

(10) Patent No.: US 11,038,013 B2
(45) Date of Patent: Jun. 15, 2021

(54) BACK-END-OF-LINE COMPATIBLE METAL-INSULATOR-METAL ON-CHIP DECOUPLING CAPACITOR

(71) Applicant: International Business Machines Corporation, Armonk, NY (US)

(72) Inventors: Paul Jamison, Hopewell Junction, NY (US); Takashi Ando, Tuckahoe, NY (US); John Greg Massey, Chittenden, VT (US); Eduard Cartier, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/520,808

(22) Filed: Jul. 24, 2019

(65) Prior Publication Data

US 2021/0028274 A1   Jan. 28, 2021

(51) Int. Cl.
*H01L 49/02* (2006.01)
*H01L 21/02* (2006.01)

(52) U.S. Cl.
CPC .......... *H01L 28/91* (2013.01); *H01L 21/0228* (2013.01); *H01L 21/02186* (2013.01);
(Continued)

(58) Field of Classification Search
CPC .............. H01L 28/91; H01L 21/02186; H01L 21/02189; H01L 21/0228; H01L 21/02356
See application file for complete search history.

(56) References Cited

U.S. PATENT DOCUMENTS 6,730,573 B1   5/2004   Ng et al.
6,940,117 B2   9/2005   Coolbaugh et al.
(Continued)

FOREIGN PATENT DOCUMENTS

CN   103579491 A   2/2014
CN   104364860 A   2/2015
(Continued)

OTHER PUBLICATIONS

Triyoso, et al., "Understanding the materials, electrical and reliability impact of Al-addition to ZrO2 for BEOL Compatible MIM Capacitors," © 2014 IEEE: 978-1-4799-2217; 2 pages.
(Continued)

*Primary Examiner* — Marc Anthony Armand
(74) *Attorney, Agent, or Firm* — Cantor Colburn LLP; Robert Sullivan (57) ABSTRACT

Embodiments of the present invention are directed to a back-end-of-line (BEOL) compatible metal-insulator-metal on-chip decoupling capacitor (MIMCAP). This BEOL compatible process includes a thermal treatment for inducing an amorphous-to-cubic phase change in the insulating layer of the MIM stack prior to forming the top electrode. In a non-limiting embodiment of the invention, a bottom electrode layer is formed, and an insulator layer is formed on a surface of the bottom electrode layer. The insulator layer can include an amorphous dielectric material. The insulator layer is thermally treated such that the amorphous dielectric material undergoes a cubic phase transition, thereby forming a cubic phase dielectric material. A top electrode layer is formed on a surface of the cubic phase dielectric material of the insulator layer.

9 Claims, 7 Drawing Sheets

(52) U.S. Cl.
CPC .. *H01L 21/02189* (2013.01); *H01L 21/02356* (2013.01); *H01L 28/75* (2013.01)

(56) References Cited

U.S. PATENT DOCUMENTS

| | | |
|---|---|---|
| 7,915,134 B2 | 3/2011 | Chinthakindi et al. |
| 9,722,011 B2 | 8/2017 | Lin et al. |
| 9,761,655 B1 | 9/2017 | Ando et al. |
| 9,881,738 B2 | 1/2018 | Zang et al. |
| 10,008,558 B1* | 6/2018 | Yang ............. H01L 21/31051 |
| 10,658,454 B2 | 5/2020 | Cho et al. |
| 2012/0092807 A1* | 4/2012 | Popovici ........ H01L 21/02197 361/313 |
| 2014/0042875 A1 | 2/2014 | Suenaga et al. |
| 2015/0116904 A1 | 4/2015 | Takeoka et al. |
| 2015/0146341 A1 | 5/2015 | Fuchigami et al. |
| 2016/0087028 A1* | 3/2016 | Hirota .............. C23C 16/45525 257/532 |
| 2018/0240861 A1 | 8/2018 | Ando et al. |
| 2019/0067488 A1 | 2/2019 | Tsai et al. |

FOREIGN PATENT DOCUMENTS

| | | |
|---|---|---|
| CN | 108257942 A | 7/2018 |
| CN | 108807345 A | 11/2018 |
| CN | 109427877 A | 3/2019 |
| EP | 3608946 A1 | 2/2020 |
| WO | 2018182160 A1 | 10/2018 |

OTHER PUBLICATIONS

International Search Report; International Application No. PCT/IB2020/056801; International Filing Date: Jul. 20, 2020; dated Nov. 3, 2020; 10 pages.

\* cited by examiner

BACK-END-OF-LINE COMPATIBLE METAL-INSULATOR-METAL ON-CHIP DECOUPLING CAPACITOR

BACKGROUND

The present invention generally relates to fabrication methods and resulting structures for semiconductor devices, and more specifically, to a back-end-of-line (BEOL) compatible metal-insulator-metal on-chip decoupling capacitor.

Advanced complementary metal-oxide-semiconductor (CMOS) technologies integrate faster transistor switching speeds with higher device densities on the semiconductor wafer. Large current spikes can occur due to a large number of "simultaneous" switching events in the circuit within a short period of time, which can cause considerable current-resistance drops and noise over the power supply network. Voltage fluctuations and power supply noise can impact the signal integrity, speed, and reliability of these devices. To mitigate high frequency noise in high speed semiconductor technologies, on-chip metal-insulator-metal decoupling capacitors (MIMCAPs) have become common. The MIMCAP can compensate for voltage fluctuations and noise by delivering charges to the power-supply network and minimizing noise propagation.

Continued advances in device speed and density drive a requirement for increased MIMCAP capacitance while simultaneously keeping the leakage current low. One method of achieving this increased capacitance without increasing leakage current is to increase the relative dielectric constant (k) of the material (e.g., hafnium oxide ($HfO_2$) and other high-k dielectrics) being used as the insulator in the MIM structure.

SUMMARY

Embodiments of the invention are directed to a method for forming back-end-of-line (BEOL) compatible on-chip MIMCAPs. This BEOL compatible process includes a thermal treatment for inducing an amorphous-to-cubic phase change in the insulating layer of the MIM stack prior to forming the top electrode. A non-limiting example of the method includes forming a bottom electrode layer and forming an insulator layer on a surface of the bottom electrode layer. The insulator layer can include an amorphous dielectric material. The insulator layer is thermally treated such that the amorphous dielectric material undergoes a cubic phase transition, thereby forming a cubic phase dielectric material. A top electrode layer is formed on a surface of the cubic phase dielectric material of the insulator layer.

Embodiments of the invention are directed to a method for forming back-end-of-line (BEOL) compatible on-chip MIMCAPs. This BEOL compatible process includes a thermal treatment for inducing an amorphous-to-cubic phase change in the insulating layer of the MIM stack prior to forming the top electrode. A non-limiting example of the method includes forming a partial metal-insulator-metal stack having a bottom electrode layer and an insulator layer. The insulator layer includes an amorphous dielectric material. The partial metal-insulator-metal stack is thermally treated such that the amorphous dielectric material undergoes a cubic phase transition, thereby forming a cubic phase dielectric material. A top electrode layer is formed on a surface of the partial metal-insulator-metal stack, thereby defining a completed metal-insulator-metal stack.

Embodiments of the invention are directed to a semiconductor structure. A non-limiting example of the semiconductor structure includes a bottom electrode layer and an insulator layer on a surface of the bottom electrode layer. The insulator layer includes a cubic phase dielectric material. A top electrode layer is positioned on a surface of the cubic phase dielectric material of the insulator layer.

Embodiments of the invention are directed to a semiconductor structure. A non-limiting example of the semiconductor device includes a bottom electrode layer and an insulator layer on a surface of the bottom electrode layer. The insulator layer includes a cubic phase dielectric material. A thermal treatment layer is formed on a surface of the insulator layer. A top electrode layer is formed on a surface of the thermal treatment layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, while hafnium oxide ($HfO_2$) and other high-k gate dielectrics have been successfully incorporated within MIMCAP applications, there remains a significant difference in the thermal budget of gate dielectric applications and MIMCAP applications that these dielectrics are exposed to after deposition. The gate dielectric, which is deposited prior to any metallization, will typically be exposed to a relatively high thermal budget compared to the insulator layer of a decoupling MIMCAP, which is usually placed between wiring levels in the back-end-of-line (BEOL) and is subject to the limited BEOL thermal budget.

Because the thermal budget after deposition will affect the crystal structure of a material, and different crystal phases of the same material can have dramatically different dielectric constants, the actual dielectric constant of a particular "high-k" material can vary significantly depending on whether it is used as a gate dielectric or as a MIM insulator. For example, conventional $HfO_2$-based or other high-k dielectric based MIMCAPs typically provide an insulator k value that is limited to a range from about 18 to 21 (e.g., $Al_2O_3/HfO_2/Al_2O_3$ or $HfO_2/Al_2O_3/HfO_2$ stacks).

Turning now to an overview of aspects of the present invention, one or more embodiments of the invention address the above-described shortcomings of the prior art by providing a novel MIM structure that includes a TiN/cubic $ZrO_2$/TiN stack that is thermally treated prior to forming the top TiN layer (top electrode) to convert amorphous $ZrO_2$ to cubic-phase $ZrO_2$. The thermal treatment can include the introduction of a thermal treatment layer (e.g., an ALD metal capping layer) and/or a BEOL compatible thermal anneal (e.g., an anneal at a temperature of about 400 to 450 degrees Celsius) prior to deposition of the top TiN electrode by PVD.

The inventors have found that $ZrO_2$, which has nominally the same or a lower dielectric constant than $HfO_2$, can contribute significantly improved performance to a MIMCAP when subjected to a carefully chosen thermal budget prior to the full electrode deposition. This effect is driven by the formation of the cubic (highest-k) phase of $ZrO_2$ from the as-deposited amorphous state at a BEOL compatible temperature of less than 500 Celsius. The thermally treated cubic $ZrO_2$ can achieve a k value of 29-31, far exceeding the 18-21 k value offered using untreated $HfO_2$ or $ZrO_2$. Conversely, when a thermal treatment is done after the top electrode is formed (instead of before it), a higher temperature is required to get the same capacitance improvement, and the leakage current of the final device is compromised. Moreover, while $HfO_2$ can undergo an analogous cubic phase transformation, this phase change does not occur for $HfO_2$ until higher temperatures that are not suitable for BEOL processing (e.g., higher than about 500 degrees Celsius). In other words, the novel TiN/cubic $ZrO_2$/TiN MIM structure presented herein is a BEOL compatible MIM structure uniquely suited to current and future on-chip decoupling capacitor applications.

Figure 1:
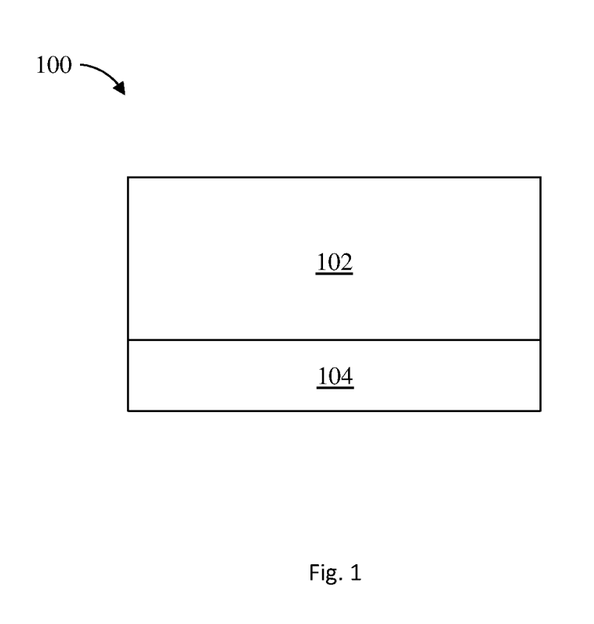
FIG. 1 depicts a cross-sectional view of a semiconductor structure after an initial set of processing operations according to one or more embodiments of the invention.
Figure 2:
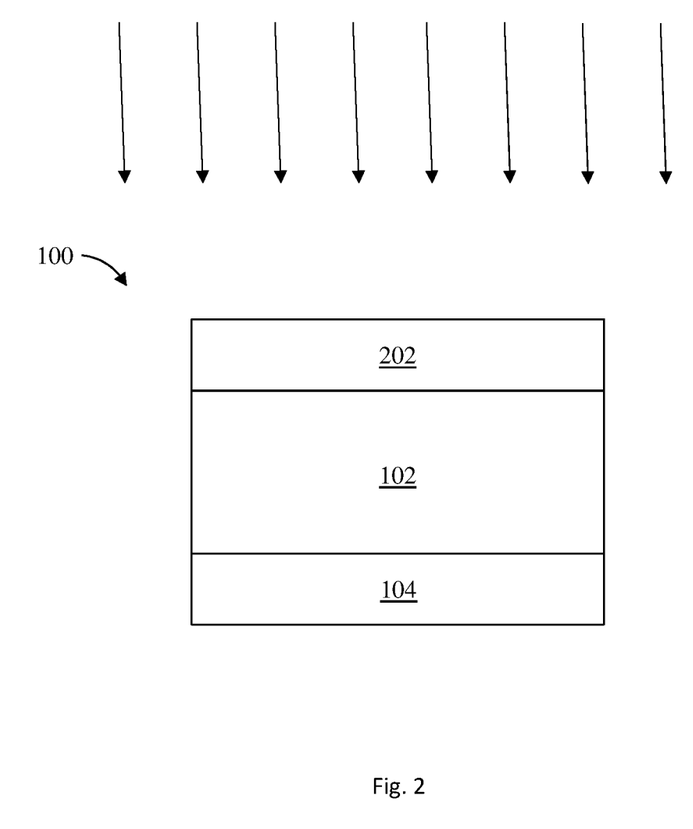
FIG. 2 depicts a cross-sectional view of the semiconductor structure after additional processing operations according to one or more embodiments of the invention.
Figure 3:
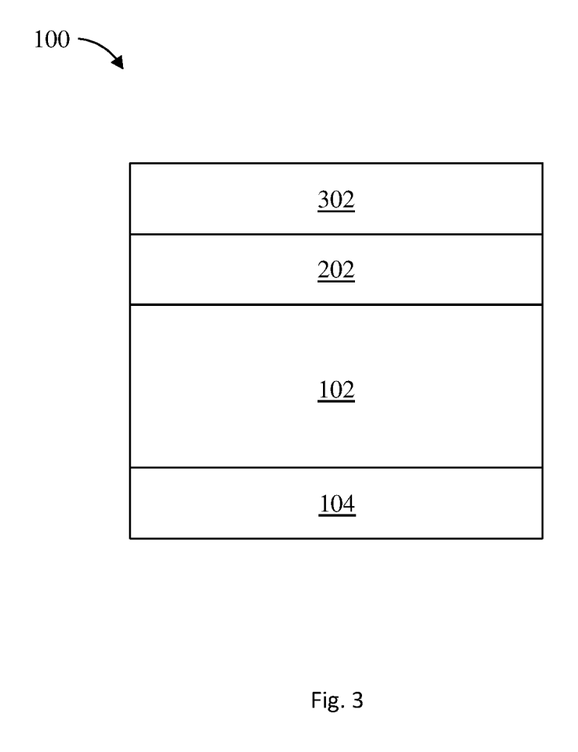
FIG. 3 depicts a cross-sectional view of the semiconductor structure after additional processing operations according to one or more embodiments of the invention.

Turning now to a more detailed description of aspects of the present invention, FIGS. 1-3 depict cross-sectional views of a semiconductor structure 100 after fabrication operations have been performed in accordance with embodiments of the invention to form a final semiconductor device. In some embodiments of the invention, the final semiconductor device can be a metal-insulator-metal on-chip decoupling capacitor. While shown as a single MIMCAP for ease of illustration, it is understood that any number of MIMCAPs can be formed in this manner. In some embodiments of the invention, a plurality of MIMCAPs are formed on a substrate (not shown).

The substrate can include any suitable substrate material, such as, for example, monocrystalline Si, SiGe, SiC, III-V compound semiconductor, II-VI compound semiconductor, or semiconductor-on-insulator (SOI). In some embodiments of the invention, the substrate includes a buried oxide layer. In some embodiments of the present invention, the substrate includes front-end-of-line (FEOL) devices and one or more BEOL interconnect layers (metal lines and/or vias formed in an interlayer dielectric). In some embodiments of the invention, each MIMCAP is electrically isolated using an interlayer dielectric formed on the substrate.

In the embodiment of the invention shown in FIG. 1, the semiconductor structure 100 includes an insulator layer 102 (sometimes referred to as a dielectric layer) formed on a bottom electrode 104 (sometimes referred to as a bottom plate contact or metal layer). The bottom electrode 104 can be formed using known metallization techniques. In some embodiments of the invention, the bottom electrode 104 is deposited over a substrate (not shown) using chemical vapor deposition (CVD), plasma-enhanced CVD (PECVD), ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, or other like process.

In some embodiments of the invention, a substrate or interlayer dielectric (not shown) is patterned with trenches, and the bottom electrode 104 is formed or deposited in the trench. In some embodiments of the invention, the bottom electrode 104 is overfilled into the trenches, forming overburdens that can be planarized using, for example, CMP. In some embodiments of the invention, the bottom electrode 104 is formed to a thickness of 5 to 25 nm, for example 10 nm, although other thicknesses are within the contemplated scope of the invention.

The bottom electrode 104 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the bottom electrode 104 is TiN. In some embodiments of the invention, the bottom electrode 104 is TiN deposited using PVD (for example, sputtering).

The insulator layer 102 is a dielectric layer formed on a surface of the bottom electrode 104. The insulator layer 102 can be a dielectric material having a dielectric constant greater than 3.9. Non-limiting examples of suitable materials for the dielectric material include oxides, nitrides, oxynitrides, silicates (e.g., metal silicates), aluminates, titanates, nitrides, or any combination thereof. In some embodiments of the invention, the insulator layer 102 can be a high-k dielectric material having a dielectric constant greater than 7.0. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The insulator layer 102 can be formed by suitable deposition processes, for example, CVD, PECVD, ALD, evaporation, PVD, chemical solution deposition, or other like processes. The thickness of the insulator layer 102 can vary depending on the deposition process as well as the composition and number of high-k dielectric materials used. The insulator layer 102 can have a thickness in a range from about 0.5 to about 20 nm, although other thicknesses are within the contemplated scope of the invention. In some embodiments of the invention, the insulator layer 102 is amorphous zirconium dioxide deposited using ALD.

FIG. 2 depicts a cross-sectional view of the semiconductor structure 100 after a processing operation according to one or more embodiments of the invention. As illustrated in FIG. 2, the semiconductor structure 100 is subjected to a BEOL compatible thermal treatment to convert the amorphous insulator material to the cubic phase (e.g., amorphous $ZrO_2$ to cubic $ZrO_2$). In some embodiments of the invention, the thermal treatment includes an anneal at a temperature of less than 500 degrees Celsius. In some embodiments of the invention, the thermal treatment includes the deposition of a thermal treatment layer 202 on a surface of the insulator layer 102. In some embodiments of the invention, the thermal treatment includes both an anneal and the deposition of the thermal treatment layer 202.

In embodiments where the thermal treatment includes an anneal, the anneal can be a furnace anneal using a carrier gas at a temperature of about 400 to 450 degrees Celsius. In some embodiments of the invention, the anneal time can be 10 seconds, 30 seconds, 1 minute, 2 minutes, 10 minutes, an hour, or two hours, depending on the thickness of the insulator layer 102 for the particular application. As discussed with respect to FIG. 4, the anneal time can be selected based on the thickness of the insulator layer 102 to ensure that the amorphous $ZrO_2$ undergoes a phase change to cubic $ZrO_2$.

In embodiments where the thermal treatment includes the deposition of a thermal treatment layer 202, the thermal treatment layer 202 can include, for example, a metal capping material. The metal capping material can include, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

In some embodiments of the invention, the thermal treatment layer 202 is TiN deposited using ALD at a temperature of 400 to 450 degrees Celsius. Use of ALD TiN instead of a simple furnace anneal is attractive for several reasons. ALD TiN can be easily deposited following high-k deposition of the insulator layer 102 without breaking vacuum, eliminating a source of defects which can increase leakage and reduce reliability. Also, ALD is a less energetic deposition technique than PVD and can reduce intermixing should multilayer dielectrics be required.

FIG. 3 depicts a cross-sectional view of the semiconductor structure 100 after a processing operation according to one or more embodiments of the invention. As illustrated in FIG. 3, a top electrode 302 can be formed on a surface of the thermal treatment layer 202 (if present) or directly on a surface of the insulator layer 102 (when the thermal treatment layer 202 is not present). The top electrode 302 can be formed using known metallization techniques. In some embodiments of the invention, the top electrode 302 is deposited using CVD, PECVD, UHVCVD, RTCVD, MOCVD, LPCVD, LRPCVD, ALD, PVD, chemical solution deposition, or other like process.

The top electrode 302 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the top electrode 302 is TiN. In some embodiments of the invention, the top electrode 302 is TiN deposited using PVD (for example, sputtering). The top electrode 302 can be formed in a similar manner as the bottom electrode 104. The top electrode 302 can be formed to a same or a different thickness as the bottom electrode 104.

Figure 4:
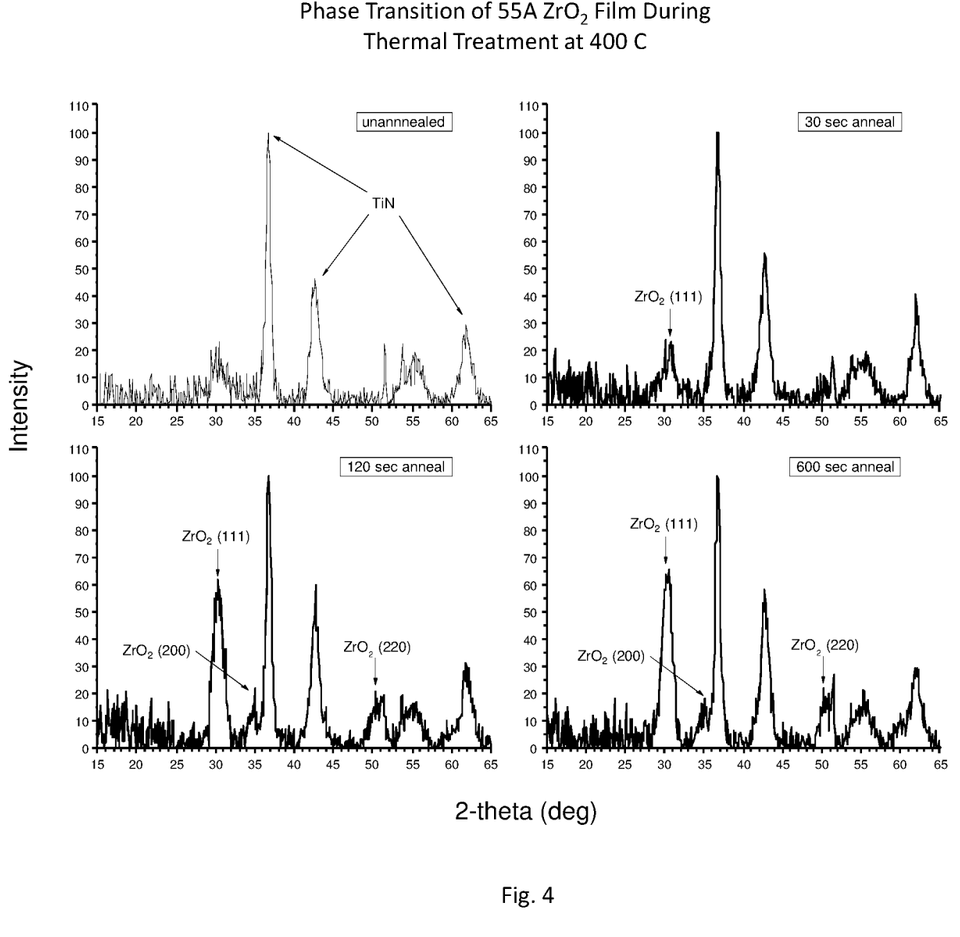
FIG. 4 depicts the phase transition of amorphous $ZrO_2$ to cubic $ZrO_2$ after a thermal treatment according to one or more embodiments of the invention.

FIG. 4 depicts the phase transition of amorphous $ZrO_2$ to cubic $ZrO_2$ after a thermal treatment according to one or more embodiments of the invention. As illustrated in FIG. 4, $ZrO_2$ can be crystallized into the higher k cubic phase at BEOL-compatible temperatures of less than or equal to about 400 degrees Celsius. FIG. 4 shows the development of the cubic phase as the annealing time of a 55 A $ZrO_2$ film at 400 degrees Celsius is increased from 30 sec to 10 minutes. The peaks at 35, 42, and 52 are the signature of the bottom TiN electrode and do not change with anneals; but, the peaks at 30.2 and 50.3 degrees which are seen to develop as the anneal time increases match with the (111) and (220) planes of the cubic phase of $ZrO_2$. Without wishing to be bound by theory, these two planes are expected to have the highest intensity peaks based on the powder diffraction pattern ($I/I_o=100$ for the (111) plane and $I/I_o=59$ for the (220) plane). The intensity of the (111) and (220) peaks relative to that of the bottom electrode increases significantly between 30 sec and 2 minutes, with some additional increase between 2 minutes and 10 minutes.

Figure 5:
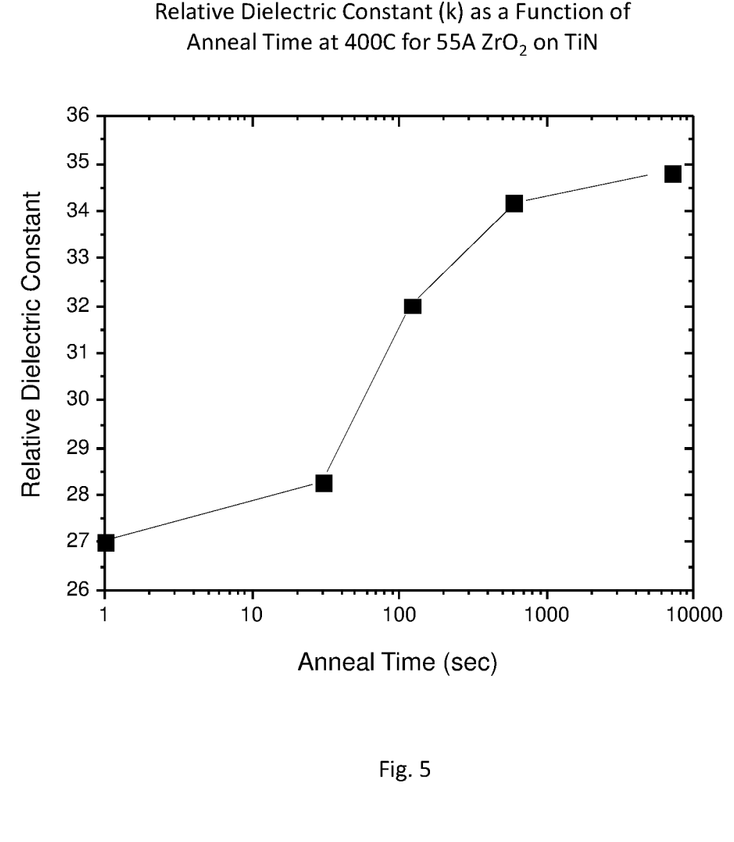
FIG. 5 depicts the calculated value of the relative dielectric constant (k) of a 55 Å thick $ZrO_2$ film on TiN during an anneal at 400 degrees Celsius according to one or more embodiments of the invention.
Figure 6:
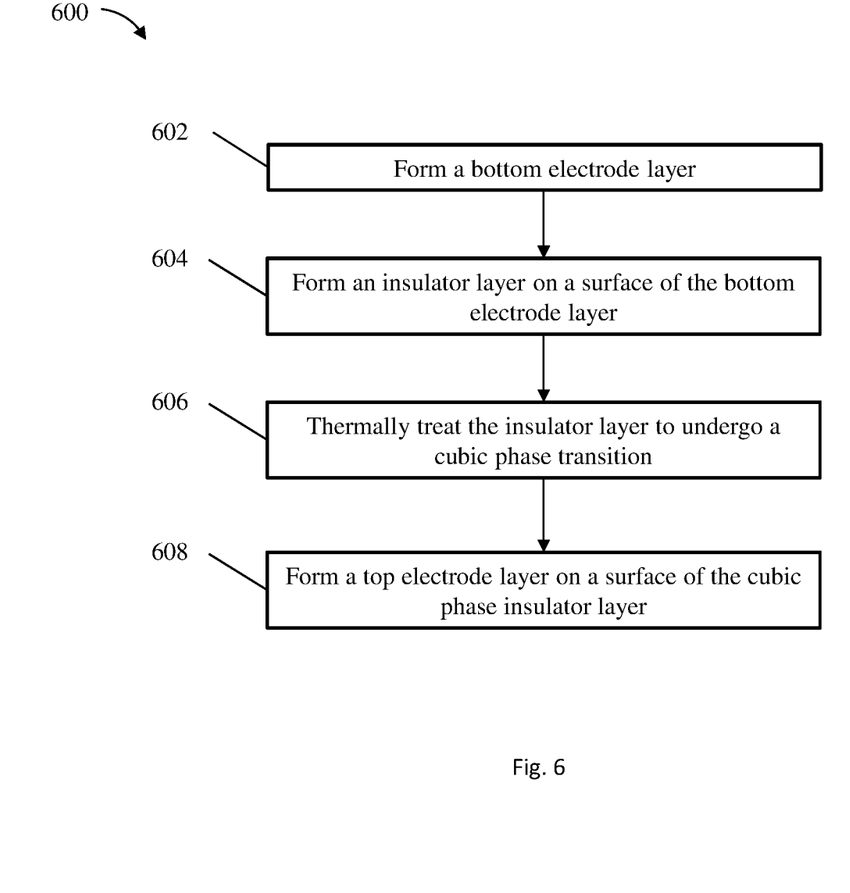
FIG. 6 depicts a flow diagram illustrating a method according to one or more embodiments of the invention.

FIG. 5 depicts the calculated value of the relative dielectric constant (k) of a 55 A thick $ZrO_2$ film on TiN during an anneal at 400 degrees Celsius. As shown in FIG. 6, the $ZrO_2$ layer has the property of crystallizing to its high-k cubic phase at temperatures relatively lower than is typical for $HfO_2$. Advantageously, the cubic phase $ZrO_2$ can reach a dielectric constant value that is greater than 27 after about 30 seconds. A dielectric constant value of about 35 (about 34.7) is achieved after about 2 hours. Thus, the present cubic $ZrO_2$-based MIMCAP can achieve high capacitance with a relatively thick high-k layer which keeps the leakage current low, all while maintaining BEOL compatible temperatures.

FIG. 6 depicts a flow diagram 600 illustrating a method for forming a semiconductor device according to one or more embodiments of the invention. As shown at block 602, a bottom electrode layer is formed. In some embodiments of the invention, the bottom electrode layer includes titanium nitride. In some embodiments of the invention, the bottom electrode layer is deposited using PVD.

At block 604, an insulator layer is formed on a surface of the bottom electrode layer. The insulator layer can include an amorphous dielectric material. In some embodiments of the invention, the insulator layer includes zirconium dioxide, the amorphous dielectric material includes amorphous zirconium dioxide, and the cubic phase dielectric material includes cubic zirconium dioxide.

At block 606, the insulator layer is thermally treated such that the amorphous dielectric material undergoes a cubic phase transition, thereby forming a cubic phase dielectric material. In some embodiments of the invention, the cubic phase dielectric material includes a dielectric constant of about 28 to about 35.

In some embodiments of the invention, thermally treating the insulator layer includes a furnace anneal at a temperature of about 400 degrees Celsius to about 450 degrees Celsius prior to forming the top electrode. In some embodiments of the invention, the furnace anneal includes an anneal time of about 10 seconds, 30 seconds, 1 minute, 2 minutes, 10 minutes, 1 hour, or 2 hours.

In some embodiments of the invention, thermally treating the insulator layer includes forming a thermal treatment layer on a surface of the amorphous dielectric material of the insulator layer. In some embodiments of the invention, the thermal treatment layer includes titanium nitride. In some embodiments of the invention, the titanium nitride is deposited using atomic layer deposition at a cycle temperature of about 400 degrees Celsius to about 450 degrees Celsius.

At block 608, a top electrode layer is formed on a surface of the cubic phase dielectric material of the insulator layer. The top electrode layer can be formed in a similar manner as the bottom electrode layer.

Figure 7:
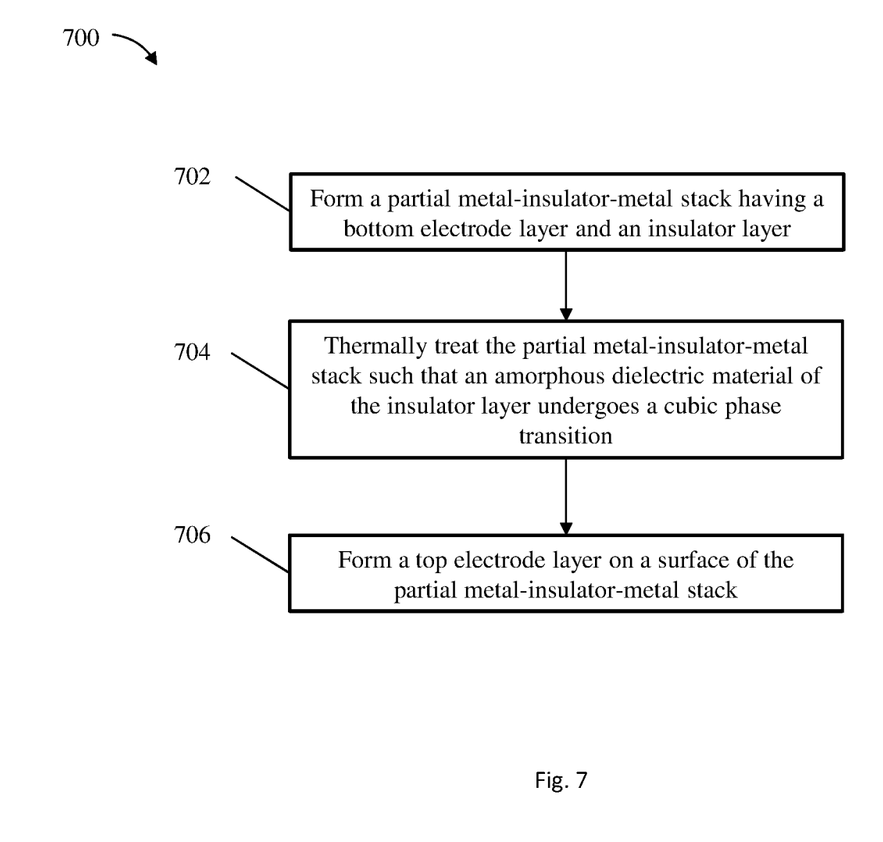
FIG. 7 depicts a flow diagram illustrating a method according to one or more embodiments of the invention.

FIG. 7 depicts a flow diagram 700 illustrating a method for forming a semiconductor device according to one or more embodiments of the invention. As shown at block 702, a partial metal-insulator-metal stack is formed. The partial metal-insulator-metal stack includes a bottom electrode layer and an insulator layer. The insulator layer includes an amorphous dielectric material. In some embodiments of the invention, the bottom electrode layer includes titanium nitride. In some embodiments of the invention, the bottom electrode layer is deposited using PVD.

At block 704, the partial metal-insulator-metal stack is thermally treated such that the amorphous dielectric material undergoes a cubic phase transition, thereby forming a cubic phase dielectric material. In some embodiments of the invention, the insulator layer includes zirconium dioxide, the amorphous dielectric material includes amorphous zirconium dioxide, and the cubic phase dielectric material includes cubic zirconium dioxide. In some embodiments of the invention, the cubic phase dielectric material includes a dielectric constant of about 28 to about 35.

At block 706, a top electrode layer is formed on a surface of the partial metal-insulator-metal stack, thereby defining a completed metal-insulator-metal stack.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a bottom electrode layer;
   forming an insulator layer directly on a surface of the bottom electrode layer, the insulator layer comprising an amorphous dielectric material;
   thermally treating the insulator layer such that the amorphous dielectric material undergoes a cubic phase transition, thereby forming a cubic phase dielectric material, wherein thermally treating the insulator layer comprises forming a thermal treatment layer comprising titanium nitride directly on a surface of the amorphous dielectric material using atomic layer deposition (ALD) without breaking vacuum; and
   forming a top electrode layer comprising titanium nitride directly on a surface of the thermal treatment layer using physical vapor deposition (PVD).

2. The method of claim 1, wherein thermally treating the insulator layer comprises annealing the insulator layer at a temperature that is within a range from about 400 degrees Celsius to about 450 degrees Celsius prior to forming the top electrode.

3. The method of claim 2, wherein the annealing the insulator layer comprises an anneal time selected from a group consisting of about 10 seconds, about 30 seconds, about 1 minute, about 2 minutes, about 10 minutes, about 1 hour, and about 2 hours.

4. The method of claim 1, wherein the titanium nitride is deposited using atomic layer deposition at a cycle temperature within a range from about 400 degrees Celsius to about 450 degrees Celsius.

5. The method of claim 1, wherein the insulator layer comprises zirconium dioxide, the amorphous dielectric material comprises amorphous zirconium dioxide, and the cubic phase dielectric material comprises cubic zirconium dioxide.

6. The method of claim 1, wherein the cubic phase dielectric material comprises a dielectric constant within a range from about 28 to about 35.

7. A method for forming a semiconductor device, the method comprising:
   forming a partial metal-insulator-metal stack comprising a bottom electrode layer and an insulator layer, the insulator layer comprising an amorphous dielectric material;
   thermally treating the partial metal-insulator-metal stack such that the amorphous dielectric material undergoes a cubic phase transition, thereby forming a cubic phase dielectric material, wherein thermally treating the partial metal-insulator-metal stack comprises forming a thermal treatment layer comprising titanium nitride directly on a surface of the amorphous dielectric material using atomic layer deposition (ALD) without breaking vacuum; and
   forming a top electrode layer comprising titanium nitride directly on a surface of the thermal treatment layer using physical vapor deposition (PVD), thereby defining a completed metal-insulator-metal stack.

8. The method of claim 7, wherein the insulator layer comprises zirconium dioxide, the amorphous dielectric material comprises amorphous zirconium dioxide, and the cubic phase dielectric material comprises cubic zirconium dioxide.

9. The method of claim 7, wherein the cubic phase dielectric material comprises a dielectric constant within a range from about 28 to about 35.

* * * * *